United States Patent
Nakashima et al.

(10) Patent No.: US 6,770,508 B2
(45) Date of Patent: Aug. 3, 2004

(54) ELECTRODE FOR SILICON CARBIDE SEMICONDUCTOR, SILICON CARBIDE SEMICONDUCTOR ELEMENT COMPRISING THE ELECTRODE, AND PRODUCTION METHOD THEREFOR

(75) Inventors: Kenshiro Nakashima, Aichi (JP); Yasuo Okuyama, Aichi (JP); Hitoshi Yokoi, Aichi (JP); Takafumi Oshima, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 10/718,691

(22) Filed: Nov. 24, 2003

(65) Prior Publication Data

US 2004/0099866 A1 May 27, 2004

Related U.S. Application Data

(62) Division of application No. 10/105,269, filed on Mar. 26, 2002.

(30) Foreign Application Priority Data

Mar. 27, 2001 (JP) ......................................... 2001-90042

(51) Int. Cl.[7] .............................................. H01L 21/00
(52) U.S. Cl. ........................ 438/105; 438/93; 438/655; 438/660; 136/239
(58) Field of Search ........................ 438/93, 655, 660; 136/239

(56) References Cited

U.S. PATENT DOCUMENTS 5,243,204 A 9/1993 Suzuki et al.
5,313,078 A 5/1994 Fujii et al.
5,474,619 A * 12/1995 Kreider ....................... 136/239
5,980,265 A 11/1999 Tischler
6,043,513 A 3/2000 Kronlund

FOREIGN PATENT DOCUMENTS

JP 8-139051 5/1996

OTHER PUBLICATIONS

Journal of Electronic Materials (vol. 29, No. 3, 39–397, 2000).
Applied Physics Letters (vol. 73, No. 14, 2009–2011, 1998).
IEEE Electron Device Letters (vol. EDL–3, No. 5, 111–113, 1982).

* cited by examiner

Primary Examiner—David Nelms
Assistant Examiner—Mai-Huong Tran
(74) Attorney, Agent, or Firm—Sughrue Mion, PLLC

(57) ABSTRACT

An ohmic electrode for an SiC semiconductor includes a p-type Si layer formed on the surface of a p-type SiC semiconductor, and a metal silicide layer formed on the surface of the Si layer, the metal silicide layer being formed from a metal silicide such as PtSi. The p-type Si layer is preferably formed from p-type Si having a carrier concentration equal to or higher than that of the aforementioned p-type SiC. Preferably, the ohmic electrode is formed as follows: deposition of Si is performed; deposition of a metal silicide is performed by means of laser ablation; laser irradiation is performed to thereby improve ohmic properties and enhance adhesion between the result deposition layer and the p-type SiC semiconductor, and then further deposition of the metal silicide is performed by means of laser ablation.

6 Claims, 7 Drawing Sheets

ELECTRODE FOR SILICON CARBIDE SEMICONDUCTOR, SILICON CARBIDE SEMICONDUCTOR ELEMENT COMPRISING THE ELECTRODE, AND PRODUCTION METHOD THEREFOR

CROSS REFERENCE TO RELATED APPLICATION

This is a divisional of application Ser. No. 10/105,269 filed Mar. 26, 2002; the above noted application incorporated herein by reference.

BACKGROUND OF THE INVENTION

1. Field of the Invention

The present invention relates to an electrode suitable for use with a silicon carbide semiconductor (hereinafter the electrode will be referred to as an "electrode for a silicon carbide semiconductor"), which can be reliably operated at high temperature; and more particularly to an ohmic electrode for a p-type silicon carbide semiconductor, a silicon carbide semiconductor element containing the electrode, a method for producing the electrode, and a method for producing the element.

2. Description of the Related Art

Silicon carbide (SiC) has a band gap as large as about 2.3 to 3 eV (3C-SiC has a band gap of 2.23 eV, 6H-SiC has a band gap of 3.03 eV, and 4H-SiC has a band gap of 3.26 eV; as used herein, the prefix letters C and H refer to "cubic" and "hexagonal," respectively, and the number 3, 4, or 6 associated with C or H refers to the number of repeating crystal structure units). Therefore, semiconductor properties of SiC are maintained even at a high temperature of about 600° C., and applications of SiC to semiconductor elements which can be operated at high temperature are envisaged.

When a semiconductor element exhibiting heat resistance is produced from SiC, formation of an n-type or p-type stable ohmic electrode is an important issue. For example, Japanese Patent Application Laid-Open (kokai) No. 8-139051 discloses a method for forming an ohmic electrode by carbonizing a metallic layer formed on the surface of a substrate containing silicon carbide crystals, and subjecting the layer to heat treatment.

Journal of ELECTRONIC MATERIALS (Vol. 29, No. 3, 391–397, 2000) reports that when p-Si/Ta is deposited on a p-type SiC layer, and then heat treatment is performed in an $H_2$-Ar gas atmosphere at 1,100° C. for five minutes, Ta reacts with Si to form $TaSi_2$, and p-type SiC containing a large amount of Si is generated in the vicinity of the SiC layer and the p-Si/Ta layer, resulting in formation of an ohmic electrode.

APPLIED PHYSICS LETTERS (Vol. 73, No. 14, 2009–2011, 1998) reports that when Si/Pt is deposited on a p-type 4H-SiC layer, and then heat treatment is performed at a temperature of 1,000° C. or higher, an ohmic electrode is formed. This publication also reports that when heat treatment is performed at 1,100° C., generation of a Pt—Si—C mixture layer through reaction between Pt and SiC is confirmed by means of Auger electron spectroscopy, and that the mixture layer has surface roughness.

When n-type SiC crystals (i.e., an n-type SiC semiconductor) are employed, an ohmic electrode having an ohmic junction can be formed by depositing on the n-type semiconductor a metallic compound having a work function lower than that of the n-type semiconductor. Examples of such a metallic compound include single metal elements, metallic alloys, and metallic compounds, such as Ni, Ti, Ta, W, $NiSi_X$ (nickel silicide), $TaSi_X$ (tantalum silicide), and $WSi_X$ (tungsten silicide); and mixtures thereof. These metallic compounds are known to have high melting points, to exhibit excellent heat resistance, and to be reliably employed at temperatures as high as about 600° C.

Meanwhile, when p-type SiC crystals (i.e., a p-type SiC semiconductor) are employed, an ohmic electrode having an ohmic junction can be formed by depositing on the p-type semiconductor a metallic compound having a work function higher than that of the p-type semiconductor. However, such a metallic compound has not yet been known. Therefore, in addition to Al, Ti/Al (the expression "Ti/Al" refers to an electrode formed by depositing Ti and Al successively on the surface of a semiconductor, and the same convention shall apply hereinafter), Al/Ti, or Al/Ni are employed, which utilize diffusion of Al serving as a p-type dopant. Also, a metal silicide which reacts with Si contained in a substrate, such as $PtSi_X$ (platinum silicide) or $TaSi_X$ (tantalum silicide), is employed. However, a metallic compound containing Al cannot be used reliably at high temperature, since Al has a melting point as low as 660° C.

When a metal silicide is employed to form an electrode, in general, the metal silicide is reacted with SiC through, for example, heat treatment, to thereby form an ohmic electrode. However, in this case, Si on the surface of an SiC layer is absorbed into the metal silicide, resulting in generation of a Si depletion layer (i.e., a C segregation layer) on the surface of the SiC layer. Meanwhile, the metal silicide has a portion which reacts with Si and a portion which does not react with Si, and therefore the thickness of the ohmic electrode may vary from portion to portion. Similar problems are expected to arise when a silicide-formable single metal element is employed to form an electrode.

SUMMARY OF THE INVENTION

In view of the foregoing, an object of the present invention is to provide an electrode for a silicon carbide semiconductor containing a thermally stable ohmic electrode. When the ohmic electrode is formed, reaction between a metal and a silicon carbide semiconductor (SiC semiconductor); i.e., silicification of the metal, is reduced by causing a silicon layer (Si layer) of low resistance to be present between the metal and the SiC semiconductor. Another object of the present invention is to provide a silicon carbide semiconductor element containing the electrode for a silicon carbide semiconductor, as well as a method for producing the electrode and a method for producing the element.

The electrode for a silicon carbide semiconductor of the present invention has a structure including a metal silicide layer, and a p-type Si layer provided between a p-type SiC semiconductor and the metal silicide layer, such that depletion of Si on the surface layer of the SiC semiconductor is prevented during silicification of the silicide layer. When the Si layer is formed from Si having a carrier concentration equal to or higher than that of SiC, contact resistance between the SiC semiconductor and the Si layer is reduced, to thereby improve properties of an ohmic electrode. The aforementioned p-type SiC semiconductor may be a p-type SiC semiconductor formed by doping an n-type SiC semiconductor with a dopant.

SiC employed in the present invention may be any of various SiC polytypes such as 3C-SiC, 4H-SiC, and 6H-SiC. Preferably, the Si layer is formed from Si having the same conduction-type as SiC, and, as described above, the SiC layer is formed from Si having a carrier concentration equal to or higher than that of the SiC to be employed.

No particular limitation is imposed on the method for depositing Si, and Si may be deposited using a conventional technique such as electron beam deposition, chemical vapor deposition, sputtering, or laser ablation. However, Si is preferably deposited by laser ablation. Deposition of a metal silicide is performed by laser ablation, to thereby form a metal silicide layer. In order to prevent non-uniformity in composition of the metal silicide layer and to maintain excellent ohmic properties, preferably, laser irradiation and/ or heat treatment is performed after depositing the metal silicide by laser ablation, to thereby improve ohmic properties and enhance adhesion between a SiC semiconductor, a Si layer, and the metal silicide layer.

When an electrode having a relatively large thickness (e.g., 100 nm or more) is to be formed, preferably, laser irradiation and/or heat treatment is performed after depositing a portion of a metal silicide by laser ablation, to thereby improve ohmic properties and enhance adhesion between a SiC semiconductor, a Si layer, and the metal silicide layer, and then the remaining metal silicide is deposited to thereby form an electrode of predetermined thickness. Through this procedure, ohmic properties can be reliably obtained, and adhesion between the SiC semiconductor and the electrode can be sufficiently enhanced.

Laser irradiation or heat treatment may be performed to improve ohmic properties and adhesion. However, laser irradiation is preferred, so as to reduce diffusion of the material of the electrode into the SiC semiconductor, which occurs in relation to improvement of ohmic properties. When laser irradiation is performed by use of, for example, a KrF excimer laser ($\lambda$: 248 nm, $\tau p$: 20 ns) (energy density: 1 to 2 J/cm$^2$, 50 to 200 pulses), ohmic properties can be sufficiently improved, and adhesion is improved as well. When heat treatment is performed at 800 to 1,200° C. for about one minute to one hour, ohmic properties as well as adhesion can also be improved.

Examples of the metal silicide employed for forming a metal silicide layer include suicides of at least one metal element selected from among platinum group elements, Group IVa elements, Group Va elements, Group VIa elements, and Group VIII elements. Of these metal elements, a platinum group element, particularly Pt, is widely employed. In addition to Pt, Ta, Ni, W, etc., can also be employed.

No particular limitation is imposed on the thickness of an Si layer or the thickness of a metal silicide layer prior to improvement of ohmic properties. However, when laser irradiation is performed for improving ohmic properties, the thicknesses of the Si layer and the metal silicide layer must be regulated such that the laser beam can reach the surface of the SiC semiconductor layer. Therefore, the overall thickness of the Si layer and the metal silicide layer prior to laser irradiation is preferably 1 to 100 nm, more preferably 5 to 70 nm, much more preferably 10 to 40 nm. When the overall thickness is less than 1 nm, irradiation of a laser beam may cause ablation of the Si layer and the metal silicide layer, resulting in loss of deposited Si and metal silicide. In contrast, when the overall thickness exceeds 100 nm, the laser beam may fail to reach the surface of the SiC semiconductor, resulting in insufficient improvement of ohmic properties. No particular limitation is imposed on the thickness ratio of the Si layer and the metal silicide layer, but preferably, the Si layer is thinner than the metal silicide layer. Moreover, no limitation is imposed on the overall thickness of an electrode formed through further deposition of the metallic silicide after improvement of ohmic properties.

Reference numerals are used to identify items shown in the drawings as follows:

1: p-Si/PtSi ohmic electrode
11: p-type Si layer
12: PtSi layer
2: p-type SiC semiconductor wafer
3: heat-resistant Pt capping layer
4: p-type ion implantation layer
5: n-type SiC semiconductor wafer
51: bulklayer
52: n-type epitaxial layer
6: Ta ohmic electrode

DETAILED DESCRIPTION OF THE PREFERRED EMBODIMENTS

The present invention will next be described in more detail by way of example only. However, the present invention should not be construed as being limited thereto. Comparative examples not embodying the invention will also be described to assist in understanding and appreciating the present invention.

COMPARATIVE EXAMPLE 1

Electrode Containing No Si Layer

A target and a wafer were placed in a vacuum chamber which had been evacuated to $3 \times 10^{-6}$ Torr, and a PtSi electrode was produced through laser ablation.

PtSi (purity: 99.9%, mol ratio of elements: Pt/Si=1/1, product of Kojundo Chemical Laboratory Co., Ltd.) serving as a target was irradiated with a KrF eximer laser (λ: 248 nm, τp: 20 ns) (energy density: 2.5 J/cm², 500 pulses). Through this laser irradiation, PtSi was deposited on a predetermined portion of a p-type 6H-SiC wafer (Al doping amount: $2.01 \times 10^{18}$ /cm³) which had been placed about 3 cm distant from the surface of the target, to thereby form a PtSi layer having a thickness of about 13 nm. Thereafter, the PtSi layer was irradiated with the aforementioned laser (energy density: 1.2 J/cm², 100 pulses), to thereby enhance adhesion between the PtSi layer and the SiC semiconductor wafer.

Subsequently, the aforementioned PtSi target was irradiated with the aforementioned laser (energy density: 2.5 J/cm², 3,000 pulses), to thereby form a PtSi layer (thickness: about 75 nm) on the PtSi layer formed in the precedent step, thereby producing a PtSi electrode having an overall thickness of about 90 nm. The current (I)-voltage (V) characteristic of the resultant electrode is shown by a broken line in FIG. 1.

EXAMPLE 1

Ohmic Electrode for a P-type SiC Semiconductor of the Present Invention Containing an Si Layer A target and a wafer were placed in a vacuum chamber which had been evacuated to $3 \times 10^{-6}$ Torr, and an ohmic electrode including a p-type Si layer provided between a p-type SiC semiconductor wafer and a PtSi layer was produced through laser ablation.

P-type Si (B doping amount: $1 \times 10^{19}$/cm³) serving as a target was irradiated with the aforementioned laser (energy density: 2.5 J/cm², 500 pulses). Through this laser irradiation, Si was deposited on a predetermined portion of a p-type 6H-SiC wafer (Al doping amount: $2.01 \times 10^{18}$/cm³) which had been placed about 3 cm distant from the surface of the target, to thereby form an Si layer having a thickness of about 10 nm. Thereafter, the Si target was replaced by the aforementioned PtSi, and the PtSi target was irradiated with the aforementioned laser (energy density: 2.5 J/cm², 500 pulses) to thereby deposit PtSi on the surface of the p-type Si layer, thereby forming a PtSi layer having a thickness of about 13 nm. Subsequently, the Si layer and the PtSi layer were irradiated with the aforementioned laser (energy density: 1.2 J/cm², 100 pulses), to thereby improve ohmic properties, along with adhesion between the layers and the SiC semiconductor wafer.

Thereafter, the PtSi target was irradiated with the aforementioned laser (energy density: 2.5 J/cm², 3,000 pulses), so as to form a PtSi layer (thickness: about 75 nm) on the layers, thereby producing a PtSi ohmic electrode having an overall thickness of about 100 nm. The I-V (current versus voltage) characteristic of the resultant electrode is shown by a solid line in FIG. 1.

Figure 1:
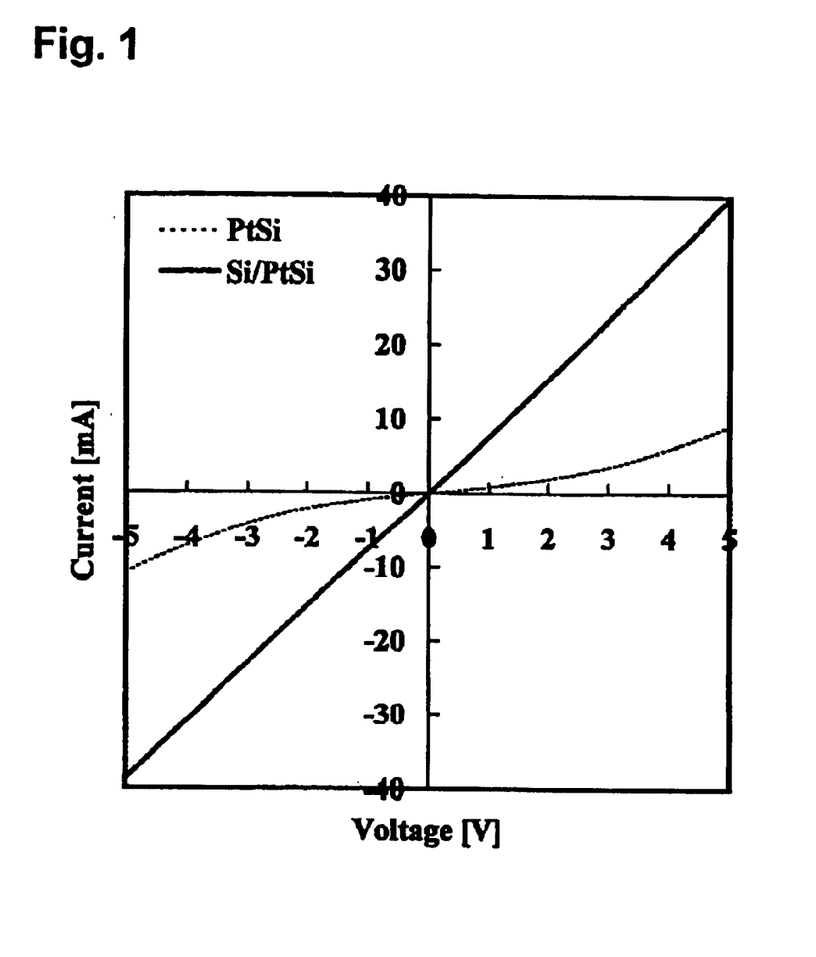
FIG. 1 is a graph comparing a p-Si/Pt electrode and a PtSi electrode in terms of I-V characteristic, each of the electrodes being formed on one surface of a p-type 6H-SiC semiconductor wafer.

Comparison between the broken line and the solid line in FIG. 1 reveals that when a p-type Si layer is present, linearity of I-V characteristic is improved, and properties of the ohmic electrode are improved.

Electric properties of the electrode produced in Example 1 were evaluated on the basis of contact resistivity calculated by means of a linear TLM (Transmission Line Model) method described in IEEE ELECTRON DEVICE LETTERS (Vol. EDL-3, No. 5, 111–113, 1982).

Figure 2:
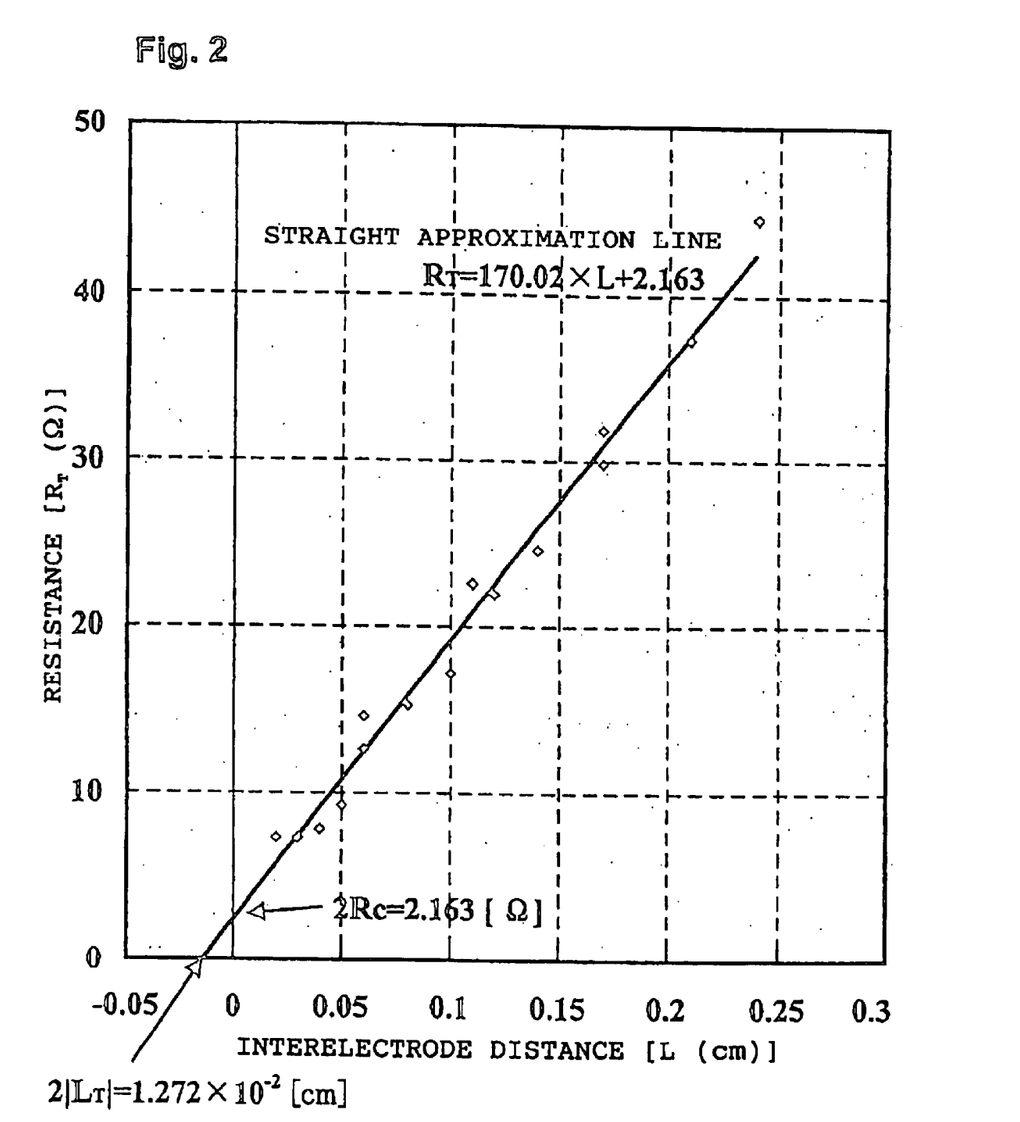
FIG. 2 is a graph showing the measurement results of interelectrode distance and total resistance, which are used for calculating the contact resistivity of a p-Si/PtSi electrode formed on one surface of a p-type 6H-SiC semiconductor wafer.

A straight approximation line shown in FIG. 2—which is obtained on the basis of the results of measurement of interelectrode distance [L (cm)] and total resistance [$R_T$ (Ω)]—is represented by the following equation:

$$R_T = 170.02 \times L + 2.163.$$

On the basis of the absolute value of [$L_X$ (cm)] corresponding to a point at which the straight line intercepts the x axis, conduction length [$L_T$(cm)] is determined to be $6.36 \times 10^{-3}$ cm (i.e., $L_T = L_X/2 = 6.36 \times 10^{-3}$ cm). In addition, on the basis of [$R_Y$ (Ω)] corresponding to a point at which the straight line intercepts the y axis, contact resistance [$R_C$ (Ω)] is determined to be 1.0815 Ω(i.e., $R_C = R_Y/2 = 1.0815$ Ω). In this case, electrode width (W) is 0.2 cm. Therefore, contact resistivity (ρ) is obtained as follows:

$$\rho = L_T \cdot W \cdot R_C = 1.38 \times 10^{-3} \Omega \cdot cm^2.$$

The thus-obtained contact resistivity is sufficiently low in relation to the carrier concentration of the above-employed wafer, although contact resistivity generally varies with the carrier concentration of a wafer and the surface condition of the wafer.

Figure 3:
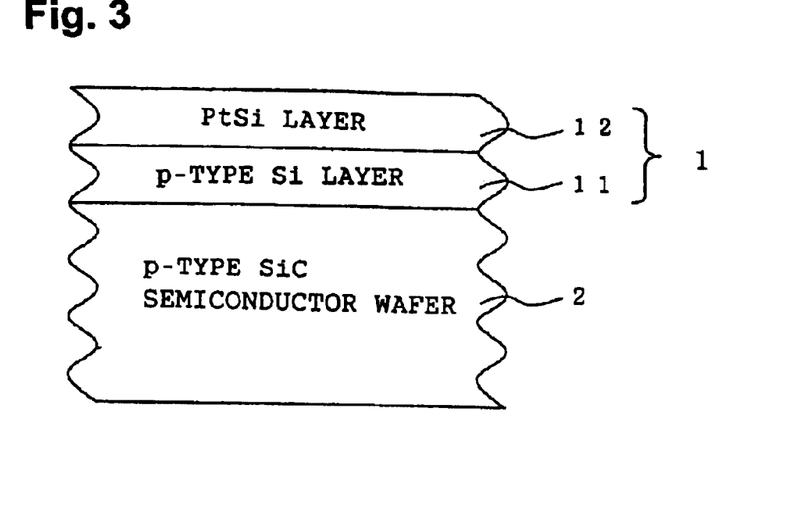
FIG. 3 is a schematic cross-sectional view showing a p-type 6H-SiC semiconductor wafer and a p-Si/PtSi ohmic electrode formed on one surface of the wafer.

FIG. 3 shows the structure of the p-Si /PtSi ohmic electrode 1 produced in Example 1. The electrode includes a p-type Si layer 11 formed on the surface of a p-type SiC semiconductor wafer 2, and a PtSi layer 12 (i.e., a metal silicide layer) formed on the surface of the p-type Si layer 11. FIG. 3 is a schematic representation of the electrode, and may not accurately represent the dimensional proportions of the layers.

TEST EXAMPLE 1

The composition of a deposition layer formed through deposition of PtSi by means of laser ablation was compared with that of a deposition layer formed through deposition of PtSi by means of vacuum deposition.

TEST EXAMPLE 1-1

Deposition Layer Formed by Means of Vacuum Deposition

At $2 \times 10^{-6}$ Torr, PtSi (about 0.1 g) was placed in a tungsten basket, and a resistance wire was heated by applying a 20 A current, so as to deposit PtSi on a predetermined portion of the aforementioned SiC semiconductor wafer, thereby forming a deposition layer having a thickness of about 30 nm.

Figure 4:
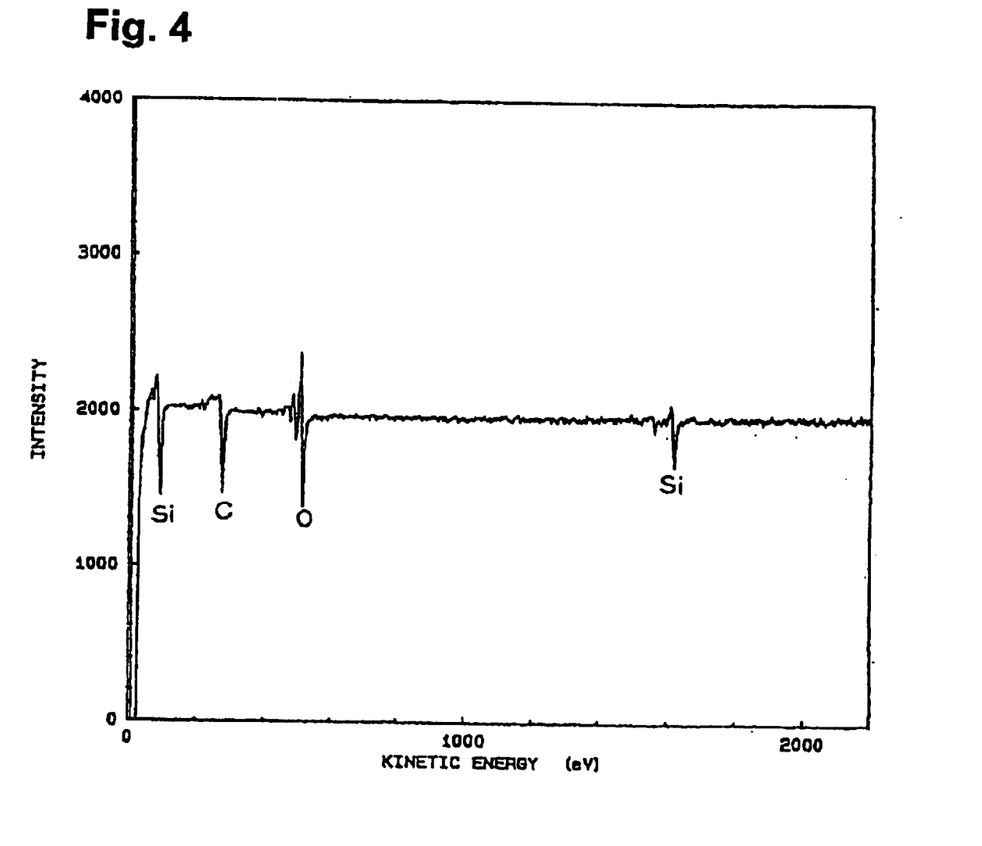
FIG. 4 is a chart showing the results of elementary analysis of a deposition layer by means of Auger electron spectroscopy, the layer being formed from PtSi by means of vacuum deposition.

The deposition layer and PtSi serving as a raw material were subjected to elementary analysis by means of Auger electron spectroscopy. FIG. 4 is a chart showing the results of the Auger electron spectroscopy analysis. Although the chart of PtSi serving as a raw material shows peaks attributed to Pt, Si, O, and C, as shown in FIG. 4, the chart of the deposition layer formed from PtSi shows only peaks attributed to Si, O, and C. The results show that the deposition layer contains no Pt component.

TEST EXAMPLE 1-2

Deposition Layer Formed by Means of Laser Ablation (PtSi Layer

The aforementioned PtSi serving as a target was irradiated with the aforementioned laser (energy density: 2.5 J/cm², 3,000 pulses), to thereby deposit PtSi on a predetermined portion of the aforementioned SiC semiconductor wafer which had been placed about 3 cm distant from the surface of the target, thereby forming a deposition layer (PtSi layer) having a thickness of about 75 nm.

Figure 5:
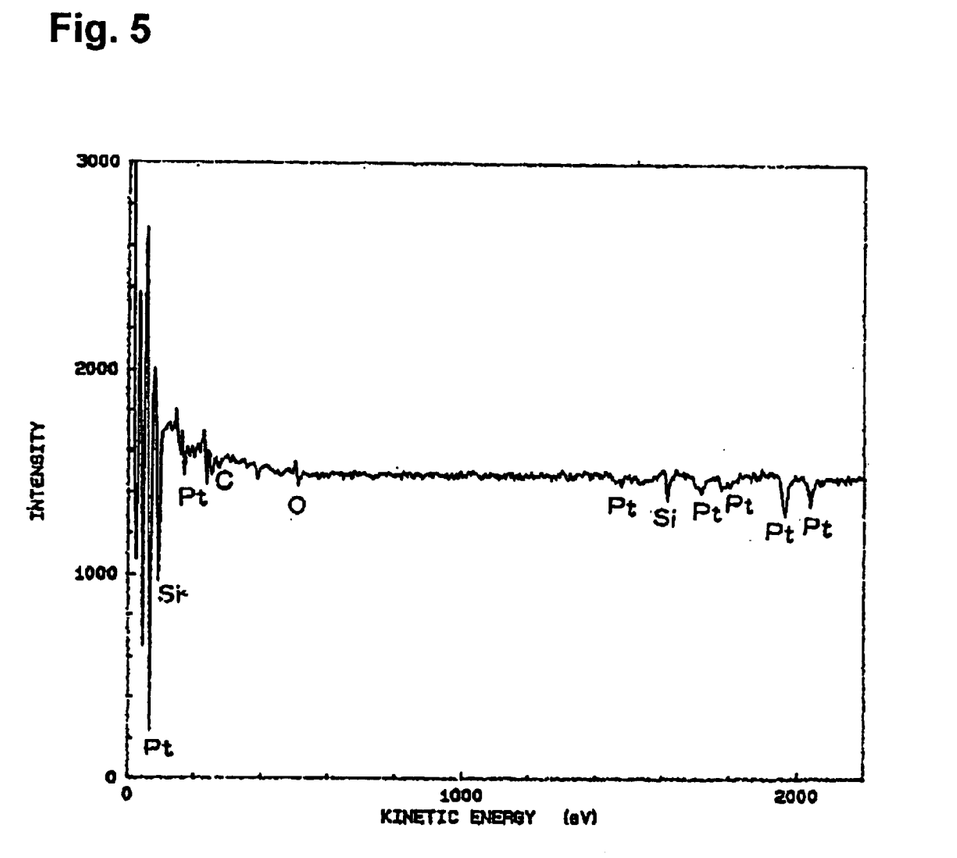
FIG. 5 is a chart showing the results of elementary analysis of a deposition layer (PtSi layer) by means of Auger electron spectroscopy, the layer being formed from PtSi by means of laser ablation.

The deposition layer was subjected to elementary analysis by means of Auger electron spectroscopy. FIG. 5 is a chart showing the results of the Auger electron spectroscopy analysis. As shown in FIG. 5, the chart of the deposition layer has peaks corresponding to Pt, Si, O, and C, thus showing formation of a PtSi layer.

The results of Test Example 1 show that when a metal silicide layer is formed through deposition of a metal silicide by means of laser ablation, an intended ohmic electrode can be formed more reliably.

COMPARATIVE EXAMPLE 2

Ohmic Electrode of Low heat Resistance Containing Al (1) Production of Electrode A Ti/Al deposited electrode, which is conventionally used as an ohmic electrode for a p-type SiC semiconductor wafer, was formed by means of vacuum deposition.

At $3 \times 10^{-6}$ Torr, Ti (about 0.05 g) was placed in a tungsten basket, and a resistance wire was heated by applying a 13 A current, so as to deposit Ti on a predetermined portion of the aforementioned SiC semiconductor wafer, thereby forming a Ti layer having a thickness of about 10 nm. Thereafter, Al (about 0.5 g) was placed in the tungsten basket, and the resistance wire was heated by applying a 14 A current, so as to deposit Al on the surface of the Ti layer, thereby forming an Al layer having a thickness of about 20 nm. Subsequently, the Ti layer and the Al layer were irradiated with the aforementioned laser (energy density: 1.0 J/cm$^2$, 100 pulses), to thereby improve ohmic properties and enhance adhesion between the layers and the SiC semiconductor wafer.

Figure 6:
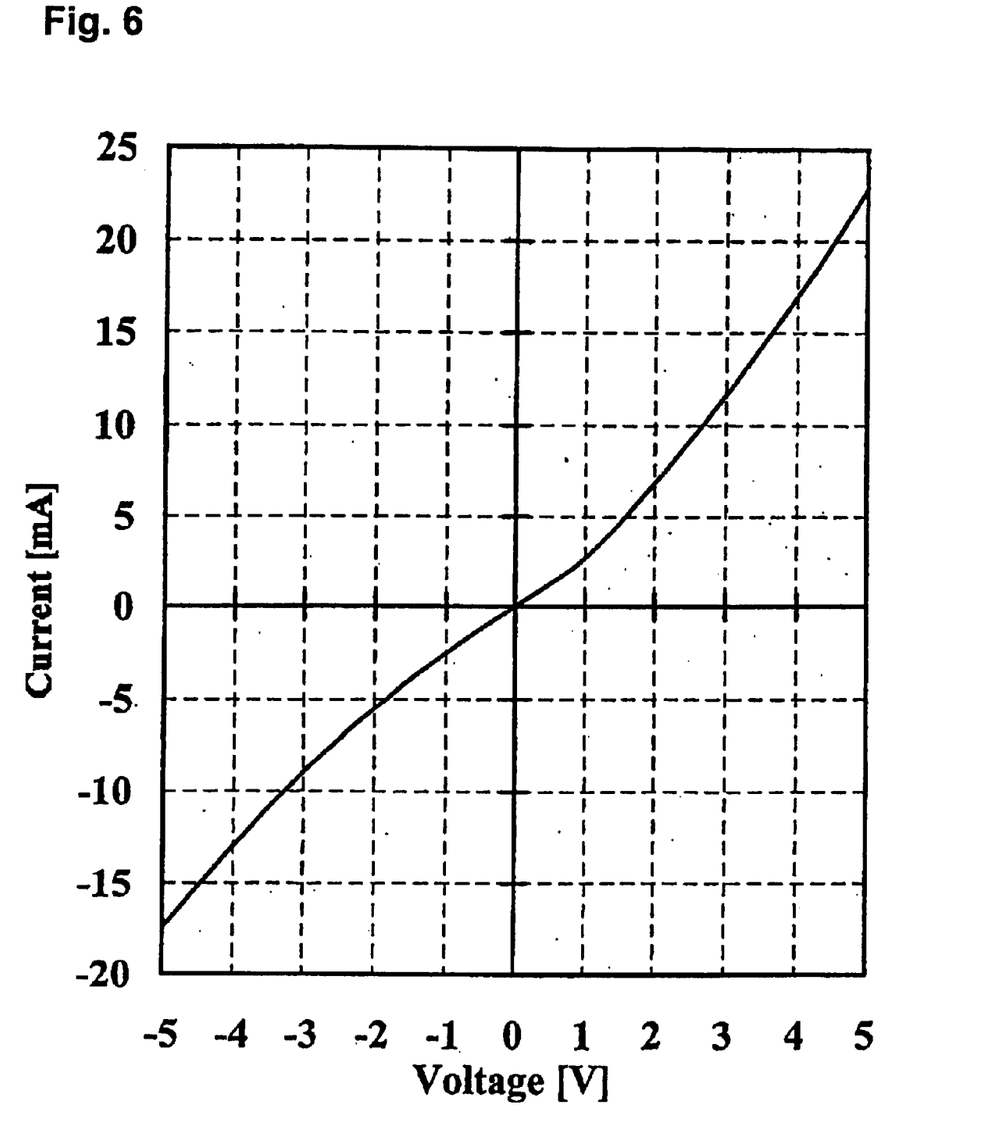
FIG. 6 is a graph showing the I-V characteristic of a Ti/Al deposited electrode formed on one surface of a p-type 6H-SiC semiconductor wafer.

Thereafter, a 14 A current was applied to the tungsten basket in which Al had been placed, so as to further deposit Al on the above-formed layers, thereby producing an ohmic electrode having an overall thickness of about 170 nm. FIG. 6 shows the I-V characteristic of the thus-produced electrode. As is clear from FIG. 6, the Ti/Al deposited electrode is in ohmic contact with the p-type SiC semiconductor wafer.

(2) Evaluation of Heat Resistance of Ti/Al Deposited Electrode

Figure 7:
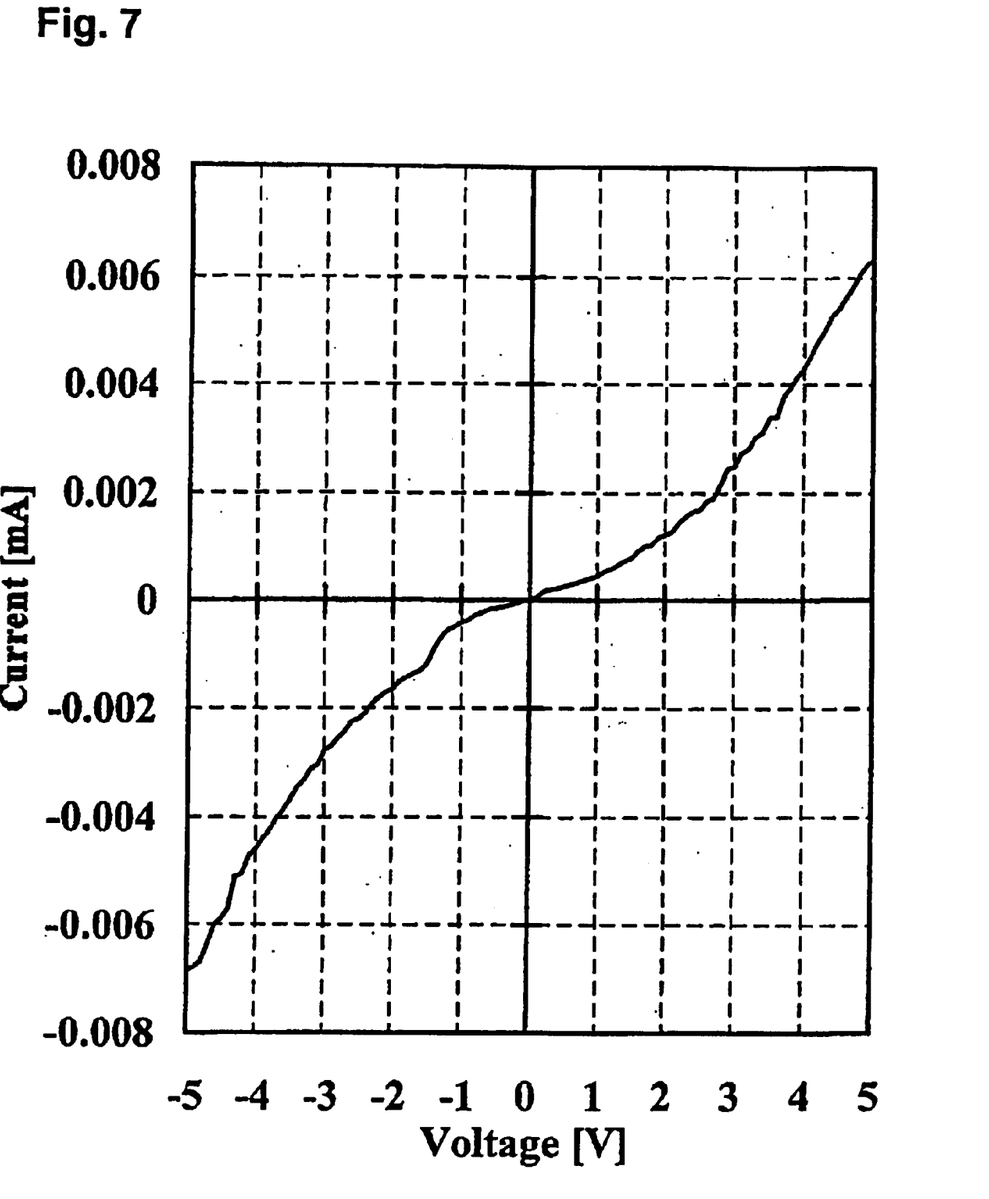
FIG. 7 is a graph showing the I-V characteristic of a Ti/Al deposited electrode after being heated at 600° C. for evaluation of heat resistance, the electrode being formed on one surface of a p-type 6H-SiC semiconductor wafer.

In order to evaluate the heat resistance of the Ti/Al-deposited ohmic electrode produced in (1) above, the electrode was heated using an infrared lamp in an air atmosphere at 600° C. for one hour. FIG. 7 shows the I-V characteristic of the electrode after the heating.

After heating, the current of the Ti/Al-deposited ohmic electrode shown in FIG. 7 was reduced to about 1/10,000 that of the current of the electrode shown in FIG. 6. Also, after heating, the thickness of the electrode was reduced from about 170 nm to about 10 nm, and the electrode no longer functioned as an electrode. The results show that an electrode predominantly containing Al, which has a melting point as low as 660° C., becomes unstable and exhibits low reliability at a high temperature of about 600° C.

Figure 8:
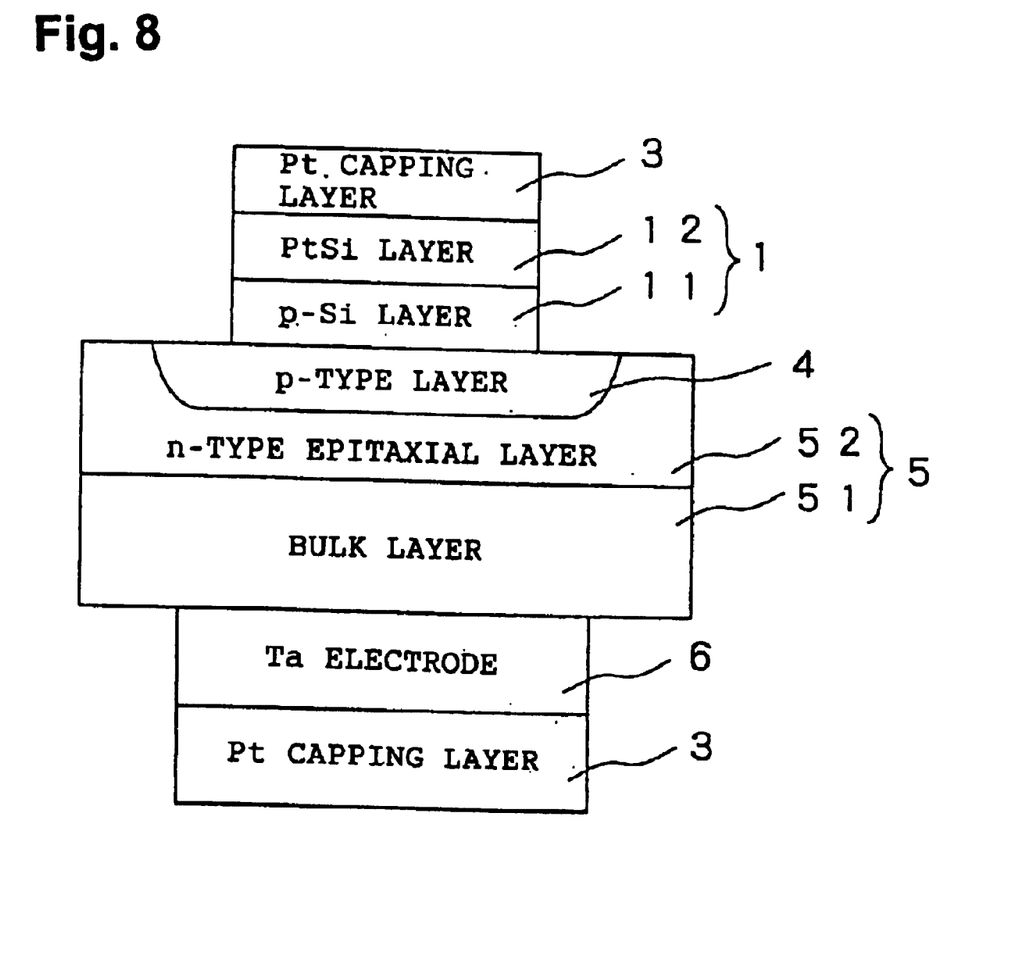
FIG. 8 is a schematic cross-sectional view showing a pn-junction diode, which is an example of the element of the present invention.

FIG. 8 shows a pn-junction diode, which is an example of the semiconductor element of the present invention. An n-type 6H-SiC wafer 5, comprising a bulk-layer 51 and an n-type epitaxial layer 52, was processed as follows. A p-type dopant such as Al was implanted into the wafer 5 by means of ion implantation; the resultant wafer was activated through annealing; and a p-type layer 4 was formed on the wafer, to thereby produce a pn-junction diode. A Ta ohmic electrode 6 was formed on the n-type SiC, and the Ta ohmic electrode 6 was covered with a Pt heat-resistant capping layer 3. The p-Si/PtSi deposited electrode 1 of the present invention, serving as an ohmic electrode, comprising a p-type Si layer 11 and a PtSi layer 12, was formed on the p-type layer 4, and the ohmic electrode was covered with a Pt heat-resistant capping layer 3.

The pn-junction diode is an example of the semiconductor element of the present invention, and the present invention may be applied to other elements. A conventional doping method may be employed, and no particular limitation is imposed on the type of electrode material. FIG. 8 is a schematic representation of the diode, and does not necessarily accurately represent the dimensional proportions of the layers.

The ohmnic electrode for a silicon carbide semiconductor of the present invention exhibits excellent heat resistance, is not easily affected by heat treatment, and exhibits excellent reliability. The silicon carbide semiconductor element of the present invention including the ohmic electrode can be operated reliably at high temperature. According to the production method of the present invention, an electrode and element exhibiting excellent properties can be produced easily and reliably.

It should further be apparent to those skilled in the art that various changes in form and detail of the invention as shown and described above may be made. It is intended that such changes be included within the spirit and scope of the claims appended hereto.

This application is based on Japanese Patent Application No. 2001-90042 filed Mar. 27, 2001, the disclosure of which is incorporated herein by reference in its entirety.

What is claimed is:

1. A method for producing an electrode adapted for use with a silicon carbide semiconductor, which electrode serves as an ohmic electrode and comprises a p-type silicon layer formed on the surface of a semiconductor formed from p-type silicon carbide, and a metal silicide layer formed on the p-type silicon layer, which method comprises forming the metal silicide layer by means of laser ablation.

2. The method as claimed in claim 1, which further comprises subjecting the metal silicide layer to at least one of laser irradiation and heat treatment, subsequent to formation of the metal silicide layer by means of laser ablation.

3. The method as claimed in claim 1, which further comprises subjecting the metal silicide layer to at least one of laser irradiation and heat treatment, subsequent to formation of the metal silicide layer by means of laser ablation; and then depositing a metal silicide on the surface of the laser-irradiated or heat-treated metal silicide layer by means of laser ablation.

4. A method for producing a silicon carbide semiconductor element comprising: a semiconductor formed from p-type silicon carbide; and an electrode adapted for use with a silicon carbide semiconductor, the electrode comprising an ohmic electrode including p-type silicon layer formed on the surface of the p-type silicon carbide semiconductor, and a metal silicide layer formed on the p-type silicon layer, which method comprises forming the metal silicide layer by means of laser ablation.

5. The method as claimed in claim 4, which further comprises subjecting the metal silicide layer to at least one of laser irradiation and heat treatment, subsequent to formation of the metal silicide layer by means of laser ablation.

6. The method as claimed in claim 4, which further comprises subjecting the metal silicide layer to at least one of laser irradiation and heat treatment, subsequent to formation of the metal silicide layer by means of laser ablation; and then depositing a metal silicide on the surface of the laser-irradiated or heat-treated metal silicide layer by means of laser ablation.

* * * * *